United States Patent [19]

Eesley et al.

[11] Patent Number: 4,637,862
[45] Date of Patent: Jan. 20, 1987

[54] WIRE-GLASS COMPOSITE AND METHOD OF MAKING SAME

[75] Inventors: Gary L. Eesley, Lake Orion; Andrew M. Mance, Royal Oak; Martin S. Meyer, Dearborn, all of Mich.

[73] Assignee: General Motors Corporation, Detroit, Mich.

[21] Appl. No.: 809,436

[22] Filed: Dec. 16, 1985

[51] Int. Cl.⁴ ............................................. C25D 5/02
[52] U.S. Cl. ...................................................... 204/15
[58] Field of Search ................. 204/15, 30, 37.1, 38.4; 428/426, 432, 433

[56] References Cited

U.S. PATENT DOCUMENTS 3,772,075 11/1973 Tarnopol et al. ................... 204/38.7
3,900,634 8/1975 Plumat et al. ......................... 428/208

OTHER PUBLICATIONS

Paunovic, Photochemical Selective Activation for Electroless Metal Deposition on Nonconductors, Journal of the Electrochemical Society, Sep. 1980, pp. 441C–447C.

R. B. Gerassimov et al, Laser Induced Decomposition of Organometallic Compounds, 12th International Quantum Electronics Conference Proceedings, p. 266 (Jun. 1982).

Primary Examiner—T. M. Tufariello
Attorney, Agent, or Firm—Lawrence B. Plant

[57] ABSTRACT

A glass substrate having an electrically conductive, abrasion-resistant, wire pattern embedded in the surface thereof made by grooving the surface of the glass, electrolytically codepositing metal and glass particles in the groove, and firing the composite to fuse the glass particles to themselves and to the glass substrate for retaining the electrodeposited metal in the groove and providing abrasion resistance thereto.

9 Claims, 4 Drawing Figures

U.S. Patent   Jan. 20, 1987   4,637,862

WIRE-GLASS COMPOSITE AND METHOD OF MAKING SAME

This invention relates to a glass substrate having an ultra-thin (i.e., narrow) abrasion-resistant, conductive pattern embedded therein and a method of making same.

BACKGROUND OF THE INVENTION

It is well known to form a pattern of electrically conductive wires on glass substrates in the manufacture of such devices as heated windows for automobiles, entry sensors for burglar alarm systems, heating panels, etc. Automobile rear window defoggers, for example, are made commercially by silk screening a paste containing a mixture of silver and glass particles onto the surface of a glass panel in a desired wire pattern and firing the panel to fuse the mixture to the panel. U.S. Pat. No. 3,900,634, for example, employs particles which are less than five microns in size including a mixture of glasses having different softening points. U.S. Pat. No. 3,772,075, on the other hand, silk screens glass particles onto a glass substrate, fires the particles to form a frit bonded to the substrate, deposits electroless metal atop the frit, and, thereafter deposits a layer of electrolytic metal atop the electroless deposit.

Heretofore, the narrowest wires producible commercially (i.e., on a regular production basis) by the silk screening process has been about 750 micrometers wide and the wires so produced have projected above the plane of the surface of the glass panel to which they have been attached. Wires of such width are quite visible and thus not only effect the appearance of the vehicle but must be widely spaced to avoid obscuring visibility through the window. Wide spacing of the wires results in non-uniform heating of the glass, while projection above the surface of the glass renders them more readily damagable (e.g., scratched). Damage to any wire can result in: a break in its electrical continuity; and large areas of unheated glass.

It would be highly desirable to have an improved wire-glass composite (e.g., window deicer) with ultra-thin, conductor wires spaced more closely together (i.e., for more uniform heating of the glass without obstructing vision) and to have conductor wires whose electrical continuity would not be as easily disrupted in the event the surface of the glass is scratched, or the like, during manufacture. Accordingly, it is the principal object of the present invention to provide such an improved wire-glass composite and a method of making same. These and other objects and advantages of the present invention will become more readily apparent from the detailed description thereof which follows.

THE INVENTION

The invention comprehends a method for forming an ultra-thin (i.e., as low as 100 micrometers or less), abrasion-resistant, conductive, metallic pattern atop, and/or beneath, the surface of a glass substrate and the product so produced.

Productwise, the invention comprehends a glass panel having a narrow groove cut in the surface thereof and filled with a metal-glass electrocodeposit which is fused to the walls defining the groove. The precise composition of the metal-glass electrocodeposit may vary substantially depending on the composition of the pattern metal (e.g., Ag, Cu, etc.) and the amount of conductivity sought. For heated automobile windshields comprising silver wire a mixture comprising about 25% by volume glass is effective. It is noted, however, that only enough glass particles need be present to bond the metal content to the substrate. Additional glass merely adds to the abrasion resistance of the wire at the expense of conductivity. The electrocodeposited glass and metal will preferably project above the surface of the substrate by about 50 micrometers or less and may overflow the edges of the groove as necessary for obtaining desired levels of electrical conductivity and/or bonding to the substrate.

Processwise, the invention comprehends: scoring the surface of a glass substrate to provide a narrow groove(s) therein in the desired pattern; depositing a starter strip of metal in the groove sufficient to provide an electrically continuous path along the length thereof for initiating subsequent electroplating therein; immersing the substrate in an electroplating bath comprising a plurality of small glass particles suspended in an aqueous solution of metal ions electrolytically reducible to form the conductive metal pattern; passing electrolyzing current through the starter strip and the electroplating bath to electrolytically fill the groove with pattern metal and glass particles codeposited from the bath; and finally firing the substrate to fuse the glass particles to themselves and to the substrate.

According to one embodiment of the invention, the glass substrate is first coated with a thin hydrophobic film and the substrate scored through the film to provide the desired groove pattern. Scoring will be such as to provide the walls defining the groove with a sufficiently rough surface to retain the catalyst used to induce electroless plating. Such scoring may be effected by scribing the surface with a diamond or by ablating it with a narrowly focused laser. In this latter regard, the ability of a given glass to be groovable by a particular laser depends on the absorptivity of the glass with respect to the wavelength of the laser to be used. The glass must be able to absorb a sufficient amount of the laser's power (i.e., absorbed power density-watts/$Cm^2$) in order to have cutting. Hence, a glass which is 100% transparent to all wavelengths cannot be grooved with a laser. Otherwise, the degree of a glass' absorptivity for particular wavelengths aids in the selection of which laser would be most effective for grooving that glass. For example, if a particular glass has a high absorptivity for long wave lengths (e.g., infrared range), it can be easily cut with infrared lasers at relatively low power settings. On the other hand, if the same glass has a low absorptivity for short wavelengths (e.g., visible range) much higher laser powers are required to obtain a sufficiently high absorbed power density (i.e., at the focus point of the laser on the glass) to effect grooving. By way of illustration, low power $CO_2$ lasers having wavelengths in the infrared range, are effective to groove glass typically used for tinted automobile windows which absorb infrared rays. Nonetheless, shorter wavelength lasers (e.g., in the visible light range) are preferred for making finer wires since such lasers cut narrower grooves than $CO_2$ lasers. Use of shorter wavelength lasers with automobile window glass, however, requires higher energy inputs to the laser in order to effect grooving. For such glasses, argon ion (i.e., green light) laser, focused to a beam waist radius of about 10 micrometers and operated at about three watts or more continuous power have proven to be effective. The hydrophobic film remains intact over the remainder of the substrate and serves to prevent electroless metal deposition in all areas except where the film has been removed (i.e., in the grooves).

After scoring, the groove is metallized sufficiently to form an electrically continuous starter strip for initiating the electrolytic codeposition of the metal-glass. According to one embodiment, the groove is metallized using a commercially available, electroless metal deposition process used to plate nonconductors (e.g., plastics). That process involves essentially: catalyzing the walls of the groove with a noble metal catalyst from an aqueous solution thereof; gently rinsing the substrate to remove the catalyst from all but the roughened groove walls; and immersing the substrate in an electroless metal plating bath to catalytically deposit metal onto the walls of the groove to form the electrically continuous starter strip.

According to another embodiment of the invention, the hydrophobic film is eliminated and the groove is simultaneously cut and catalyzed by coating the substrate with a laser-decomposable organometallic compound, such as copper formate or copper acetate (e.g., as a paste), and then focusing an argon ion laser beam directly onto the paste. If the glass is transparent, the laser beam will preferably be directed through the glass panel from the underside (i.e., uncoated) thereof to focus on the underside of the coating. The organometallic compound absorbs sufficient energy to locally heat the plate and cut the groove while at the same time decomposes to deposit a catalytically active species of metallic copper in the groove. The catalytically active copper so deposited then serves to initiate the chemical reduction of additional copper (i.e., to form the starter strip) from an aqueous electroless copper bath such as Shipley's PM-990 or PM-994 baths. The use of lasers to induce the decomposition of organometallic compounds and to form catalytically active metallic species is known and accordingly will not be dwelt upon further herein. In this regard, there phenomena have been described at (1) R. B. Gerassimov, S. M. Metev and S. K. Savtchenko, "Laser Induced Decomposition of Organometallic Compounds", 12th International Quantum Electronics Conference Proceedings, P. 266 (June 1982), and (2) M. Paunovic, "Photo-Chemical Selective Activation of Electroless Metal Deposition on Nonconductors", Journal of the Electrochemical Society, pp 441c–447c (September 1980).

According to a still further embodiment of the invention, the deposition of starter strip metal from an electroless plating bath may be eliminated altogether by decomposing larger quantities of the organometallic compound so as to metallize the groove sufficiently to directly initiate the electroplating operation without the need for additional conductors in the groove.

When the starter strip comprises copper and the electrodeposited pattern metal is to be silver, the copper starter strip is protected by immersing the substrate briefly in a conventional silver strike bath. The silver strike provides a thin protective layer of silver over the copper to prevent chemical deposition of silver onto the copper upon contact with the glass-silver electroplating bath.

Following cutting and metallization of the groove with the electroplating starter strip, the substrate is immersed in an electroplating bath comprising a plurality of small glass particles suspended (e.g., by agitation) in a solution of metal ions electrolytically reducible to form the metal of the pattern sought to be produced.

The choice of which pattern metal to codeposit with the glass particles will vary with the intended use of the glass panel. In the case of a heated automobile windshield, the pattern metal will preferably comprise silver which has a high electrical conductivity.

The substrate will preferably be positioned horizontally in the metal-glass plating bath so the glass particles may settle onto the glass during electroplating of the pattern metal. Current is then passed through the metal starter strip and the electroplating bath to electrolytically reduce the metal ions therein to the corresponding pattern metal and at the same time entrap the glass particles therein in accordance with well known inclusion plating principles. Electroplating continues until the groove is filled with the metal-glass electrocodeposit. Preferably, plating will continue after the groove is filled and until some of the codeposit projects above the groove and overflows the edges thereof. Such additional plating increases the electrical conductivity of the wire and increases the surface area of the substrate available for bonding to the metal-glass electrodeposit during the firing operation.

Following codeposition of the metal-glass in the groove, the substrate is placed in an oven and fired in air for a time and at a temperature sufficient to fuse the glass particles to each other and to the walls of the groove.

SPECIFIC EXAMPLES

The invention may better be understood when considered in the light of certain specific examples thereof which are described hereafter in conjunction with the several drawings in which.

EXAMPLE A

Figure 1:
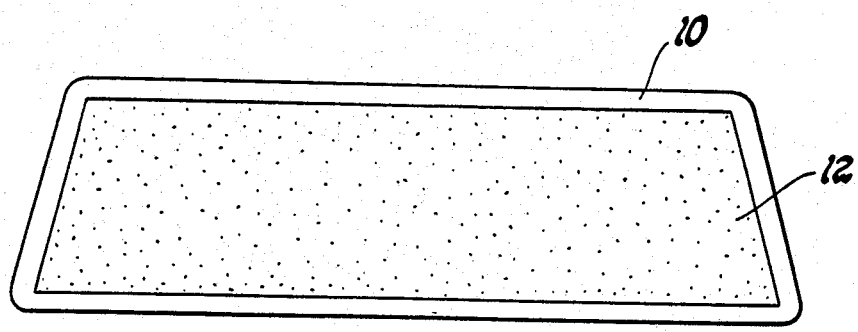
FIG. 1 is a plan view of an automobile windshield prior to grooving.
Figure 2:
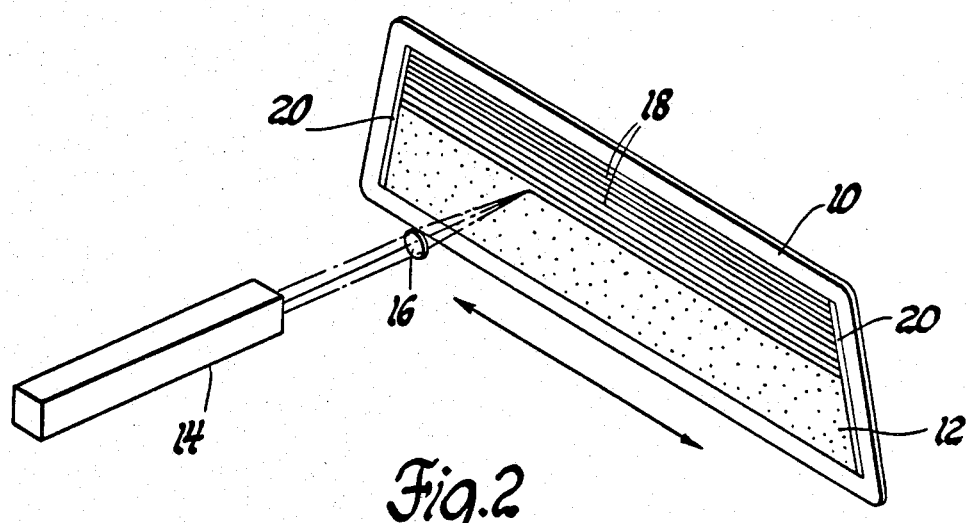
FIG. 2 is a perspective view of the windshield of FIG. 1 undergoing laser grooving.
Figure 3:
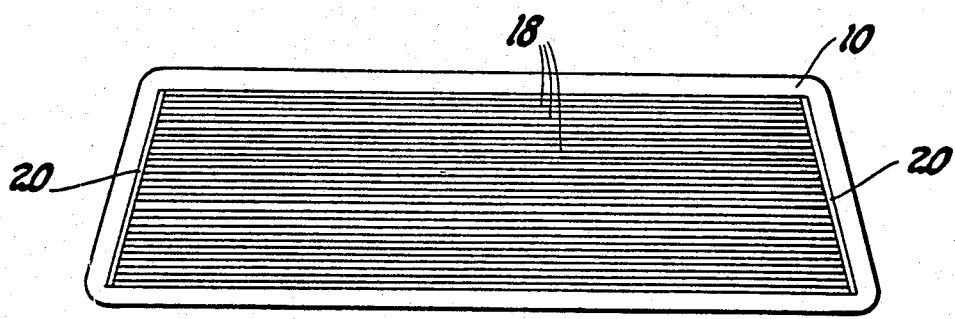
FIG. 3 is a view like FIG. 1 after the windshield has been grooved.
Figure 4:
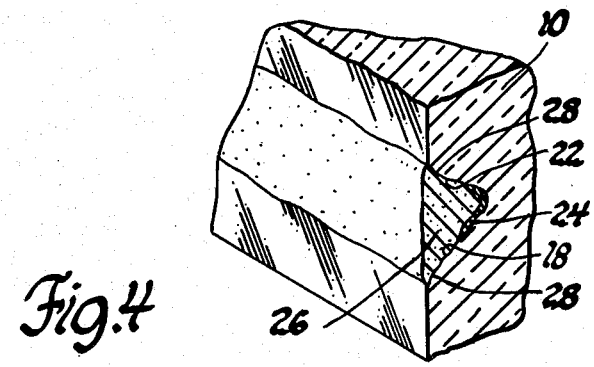
FIG. 4 is an enlarged perspective view through a glass-metal wire taken generally in a direction perpendicular to the windshield and transverse the wire.

A clean plate of typical automobile window glass 10 is first coated with a thin film 12 of hydrophobic material. An effective hydrophobic film for this purpose comprises a polysiloxane such as described in U.S. Pat. No. 3,579,540 and commercially available from the Unelko Corporation under the name "Rain-X". The Rain-X is wiped onto the glass and allowed to dry to a frosty appearance. This is repeated several times. After the last coating has been applied and dried, the surface is wiped with a wet cloth and then polished with a dry cloth. The glass panel 10 is then scored by moving the panel 10 back and forth (see FIG. 2) in front of an argon ion laser 14 whose beam is focused by lens 16 to a beam waist radius of about 20 micrometers to cut the fine grooves 18 extending across the plate and wider grooves 20 extending up the sides of the plate at the ends of the grooves 18. The wider grooves 20 will ultimately receive metal conductors which serve as bus bars for carrying current to the several heater wires to be formed in the grooves 18. The laser beam traverses the plate at a rate of about one inch per second with at least about 3 watts average continuous power. The laser beam removes a narrow band of the polysiloxane film and cuts a fine, generally V-shaped groove 18 into the surface of the panel 10 which groove is defined by rough surfaced walls 22 as illustrated in FIG. 4. The thusly scored plate 10 is then prepared for the electrocodeposition step by pretreatment according to a proprietary, commercial process used to prepare nonconduction for electroplating. A preferred such process is that used for the electroless deposition of copper which is marketed by the Shipley Co. as the Shipley Crownplate Process. More specifically, the plate 10 is sequentially: immersed for about 15 seconds in Shipley 1110A Conditioner (a wetting agent); rinsed; immersed for about 20 seconds in Shipley PM-960 Accelerator; rinsed; and finally immersed for about 10 minutes in either Shipley PM-990 or Shipley PM-994 to electrolessly deposit sufficient copper in the groove to provide a continuous electrically conductive starter strip 24 therein to conduct electroplating current therethrough for initiating electrodeposition. The plate 10 is then immersed in a conventional acid copper electroplating bath and electroplated for 5 minutes at a current density of 10 amperes per square foot to add additional copper to the starter strip 24. The plate is rinsed again and immersed for about 30 seconds in a standard silver strike bath (i.e., AgCN 9.3 g/l, free KCN 75 g/l, and $K_2CO_3 > 60$ g/l) to plate (i.e., at a current density of 10 amperes per square foot) a protective film of silver atop the copper to prevent displacement plating of Ag from the codeposition bath when contacted by the copper starter strip 24. The plate is rinsed again. The groove 18 is next electrolytically filled with a Ag-glass codeposit 26 by electroplating for about two hours at four amperes per square foot in a stirred bath comprising:

Stirring

AgC ... 93 g/l
Free KCN ... 75 g/l
KOH ... 15 g/l
$K_2CO_3$ ... >60 g/l
glass dust* ... 40 g/l
Temperature ... Room
*Owens Illinois Co. No. 00158 B (at least 80% > −400 mesh).

The plate is rinsed, dried and placed in an oven to bond the codeposit 26 to the walls 22 of the groove 18 and the surface of the substrate adjacent the groove 18 where the codeposit 26 overflows the edges 28 of the groove 18. The oven is heated up to about 600° C. over a period of about 30 minutes, shut-off and allowed to cool for about two hours before removing the panel.

EXAMPLE B

A glass panel is prepared in precisely the same manner as described in Example A except that the groove is cut through the hydrophobic film and into the glass by drawing an industrial diamond stylus thereacross at a rate of less than about one half centimeter per second. The advancing diamond so fractures the glass ahead of it as to provide the desired roughness on the walls of the groove to retain the catalyst therein during the rinsing step which follows immersion in the catalyst bath.

EXAMPLE C

A glass panel is prepared in much the same way as set forth in Example A except that the hydrophobic film 12 and the wet catalyzing steps of the Crownplate Process are eliminated. Rather, the panel 10 is coated with a slurry comprising about 2 grams of copper formate mixed with 1.2 mls. of ethylene glycol and thinned with methyl alcohol to a water-like consistency. The slurry is poured onto the panel and spread thereover by surface tension effects. When the slurry dies to a past-like consistency, an argon ion laser beam, set at an average continuous power of between 0.7 and 1.5 watts, is directed through the glass panel onto the underside of the copper formate coating and traversed at a rate of one inch/min. The beam ablates the surface of the plate to cut the groove and at the same time decomposes the copper formate to deposit in the groove a species of copper which is sufficiently catalytically active to initiate electroless copper deposition directly from either the Shipley PM-990 or PM-994 baths. After electroless copper deposition, the plate is treated in precisely the same manner as described in Example A.

EXAMPLE D

A glass panel is prepared in essentially the same way as set forth in Example C except that a thicker coating of copper formate is applied to the surface of the panel and sufficient copper deposited therefrom into the groove to serve directly as the electroplating starter strip. This option eliminates the electroless copper plating step and permits moving directly into the silver strip step. All subsequent steps remain the same as set forth above.

While the invention has been disclosed primarily in terms of specific embodiments thereof, it is not intended to be limited thereto but rather only to the extent set forth hereafter in the claims which follows.

The embodiments of the invention in which an exclusive property or privilege is claimed are defined as follows:

1. Method for forming an abrasion resistant, metallic pattern beneath the surface of a glass substrate comprising the steps of:
    scoring a narrow groove in said surface, said groove delineating said pattern;
    depositing an electrically continuous conductive strip of metal along the length of said groove;
    immersing said substrate in an electroplating bath comprising a plethora of glass particles suspended in a solution of metal ions electrolytically reducible to form the metal of said pattern;
    passing electrolyzing current through said metal strip and said bath to selectively electrolytically codeposit said pattern metal and said particles in said groove; and
    firing said substrate to a temperature and for a time sufficient to fuse said particles one to the other and to said substrate;
    whereby a precisely defined, abrasion resistant, electrically conductive pattern is formed beneath the surface of the substrate.

2. Method for forming an abrasion resistant, metallic pattern beneath the surface of a glass substrate comprising the steps of:
    coating said surface with an hydrophobic film;
    scoring a narrow groove into said surface through said hydrophobic film, said groove delineating said pattern and being defined by roughened walls for retaining a catalyst deposited in said groove;
    seeding said walls with a catalyst for initiating the chemical reduction of a metal ion from aqueous solution to form an electrically continuous conductive metal strip along the length of said groove;
    immersing said substrate in an electroless metal plating bath containing said ions to deposit said strip in said groove;

immersing said substrate in an electroplating bath comprising a plethora of glass particles suspended in a solution of metal ions electrolytically reducible to form the metal of said pattern;

passing electrolyzing current through said metal strip and said electroplating bath to selectively electrolytically codeposit said pattern metal and said particles in said groove; and firing said substrate to a temperature and for a time sufficient to fuse said particles one to the other and to said substrate;

whereby an abrasion resistant, electrically conductive pattern is formed beneath the surface of the substrate and substantially precisely defined by walls of the groove.

3. Method for forming an abrasion resistant, metallic pattern beneath the surface of a glass substrate comprising the steps of:

coating said surface with an hydrophobic film;

scribing a narrow groove into said surface through said hydrophobic film, said groove delineating said pattern and being defined by roughened walls for retaining a catalyst deposited in said groove;

immersing said substrate in an aqueous bath containing a catalyst to deposit said catalyst substantially exclusively on said walls;

immersing said substrate in an electroless metal plating bath containing chemically reducible ions responsive to said catalyst for depositing an electrically continuous conductive skin of metal on the walls of said groove;

immersing said substrate in an electroplating bath comprising a plethora of glass particles suspended in a solution of metal ions electrolytically reducible to form the metal of said pattern;

passing electrolyzing current through said metal skin and said electroplating bath to selectively electrolytically codeposit said pattern metal and said particles in said groove; and firing said substrate to a temperature and for a time sufficient to fuse said particles one to the other and to said substrate;

whereby an abrasion resistant, electrically conductive pattern is formed beneath the surface of the substrate and substantially precisely defined by walls of the groove.

4. Method for forming an abrasion resistant, metallic pattern beneath the surface of a glass substrate comprising the steps of:

coating said surface with an hydrophobic film;

traversing a narrow laser beam across said surface to selectively ablate said surface so as to form a narrow groove in said surface, said groove delineating said pattern and being defined by roughened walls for retaining catalyst deposited in said groove;

immersing said substrate in an aqueous bath containing a catalyst to deposit said catalyst substantially exclusively on said walls;

immersing said substrate in an electroless metal plating bath containing chemically reducible ions responsive to said catalyst for depositing an electrically continuous conductive skin of metal on the walls of said groove;

immersing said substrate in an electroplating bath comprising a plethora of glass particles suspended in a solution of metal ions electrolytically reducible to form the metal of said pattern;

passing electrolyzing current through said metal skin and said electroplating bath to selectively electrolytically codeposit said pattern metal and said particles in said groove; and firing said substrate for a time and at a temperature sufficient to fuse said particles one to the other and to said substrate;

whereby an abrasion resistant, electrically conductive pattern is formed beneath the surface of the substrate and substantially precisely defined by walls of the groove.

5. Method for forming an abrasion resistant, metallic pattern beneath the surface of a glass substrate comprising the steps of:

coating said surface with a layer of an organometallic compound susceptible to laser-induced decomposition;

traversing a narrow laser beam across said coated surface to (1) selectively ablate said surface so as to form a narrow groove in said surface delineating said pattern, and (2) decompose said organometallic compound and deposit sufficient metal therefrom in said groove as to provide an electrically continuous metal strip therein;

immersing said substrate in an electroplating bath comprising a plethora of glass particles suspended in a solution of metal ions electrolytically reducible to form the metal of said pattern;

passing electrolyzing current through said strip and said electroplating bath to selectively electrolytically codeposit said pattern metal and said particles in said groove; and firing said substrate for a time and at a temperature sufficient to fuse said particles one to the other and to said substrate;

whereby an abrasion resistant, electrically conductive pattern is formed beneath the surface of the substrate and substantially precisely defined by walls of the groove.

6. Method for forming an abrasion resistant, metallic pattern beneath the surface of a glass substrate comprising the steps of:

coating said surface with a layer of a cuproorganic compound susceptible to laser-induced decomposition;

traversing a narrow laser beam across said coated surface to (1) selectively ablate said surface so as to form a narrow groove in said surface delineating said pattern, and (2) decompose said cuproorganic compound and deposit catalytically active copper in said groove;

immersing said substrate in an electroless copper plating bath containing reducible copper ions responsive to said catalytic copper for depositing additional copper into said groove;

immersing said substrate in an electroplating bath comprising a plethora of glass particles suspended in a solution of metal ions electrolytically reducible to form the metal of said pattern;

passing electrolyzing current through said copper in said groove and said electroplating bath to selectively electrolytically codeposit said pattern metal and said particles in said groove; and firing said substrate for a time and at a temperature sufficient to fuse said particles one to the other and to said substrate;

whereby an abrasion resistant, electrically conductive pattern is formed beneath the surface of the substrate and substantially precisely defined by walls of the groove.

7. Process in accordance with any of claims 1–6 wherein said pattern metal comprises silver.

8. Process according to any of claims 2–4 wherein said hydrophobic film comprises polysiloxane.

9. Electrically conductive glass comprising a glass substrate, a groove cut in the surface of said substrate defining a desired conductive pattern and conductive wire filling said groove, said wire comprising a plethora of minute glass particles dispersed throughout a metal electrodeposit, said particles being fused one to the other and to the walls of said groove so as to retain said electrodeposit firmly in said groove and protect it from abrasion.

* * * * *